(12) United States Patent
Somasekhar et al.

(10) Patent No.: US 8,406,073 B1
(45) Date of Patent: Mar. 26, 2013

(54) HIERARCHICAL DRAM SENSING

(75) Inventors: Dinesh Somasekhar, Portland, OR (US); Gunjan Pandya, Portland, OR (US); Kevin Zhang, Portland, OR (US); Fatih Hamzaoglu, Portland, OR (US); Balaji Srinivasan, Hillsboro, OR (US); Swaroop Ghosh, Hillsboro, OR (US); Meterelliyoz Mesut, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 131 days.

(21) Appl. No.: 12/928,948

(22) Filed: Dec. 22, 2010

(51) Int. Cl.
*G11C 8/00* (2006.01)

(52) U.S. Cl. .................................. 365/203; 365/230.03

(58) Field of Classification Search .................. 365/203, 365/230.03
See application file for complete search history.

(56) References Cited

U.S. PATENT DOCUMENTS

| | | |
|---|---|---|
| 2007/0171747 A1 | 7/2007 | Hunter et al. |
| 2008/0165601 A1 | 7/2008 | Matick et al. |
| 2009/0316512 A1 | 12/2009 | Terzioglu et al. |
| 2010/0131825 A1* | 5/2010 | Kohler et al. ................. 714/763 |
| 2010/0315893 A1 | 12/2010 | Hong |

OTHER PUBLICATIONS

Notice of Allowance mailed May 23, 2012 for Chinese Patent Application No. 2011 20536523.X.
Int'l Search Report and Written Opinion mailed Jul. 9, 2012 for Int'l Patent Application No. PCT/US2011/060861.

* cited by examiner

*Primary Examiner* — Michael Tran
(74) *Attorney, Agent, or Firm* — Blakely, Sokoloff, Taylor & Zafman LLP

(57) ABSTRACT

A hierarchical DRAM sensing apparatus and method which employs local bit line pairs and global bit lines. A word line selects the cells in a cluster of sense amplifiers, each of the amplifiers being associated with a pair of bit lines. One of the local bit lines is selected for coupling to global bit lines and a global sense amplifier. Clusters are located in a plurality of subarrays forming a bank with the global bit lines extending from each of the banks to the global sense amplifier.

19 Claims, 5 Drawing Sheets

HIERARCHICAL DRAM SENSING

FIELD OF THE INVENTION

The invention relates to the field of dynamic random access memories (DRAMs) and in particular to the sensing of binary states in these memories.

BACKGROUND OF THE INVENTION

Typical commodity DRAMs favor a page-style architecture allowing for more rapid access to sequentially addressable memory locations. An example of one favored architecture (synchronous memory device) is described in U.S. Pat. No. 5,995,443.

Other architectures are used in DRAMs particularly where the memory is embedded or used to support a specialized application such as caching or graphics. An example is described in U.S. Pat. No. 5,544,306.

DETAILED DESCRIPTION

A hierarchical sensing architecture for a dynamic random access memory (DRAM) is disclosed. In the following description numerous specific details are set forth such as specific number of word lines and bit lines, in order to provide a thorough understanding of the present invention. It will be obvious to one skilled in the art, that the present invention may be practiced without these specific details. In other instances, well-known circuits such as address decoders are not described in detail to avoid unnecessarily obscuring the present invention.

Often DRAMs are arranged in a page-style architecture particularly suited for incremental addressing. This is not always the best architecture for some applications such as for a graphics processor or where a DRAM is part of a cache memory. As will be seen, the present disclosure describes an alternative arrangement to the more traditional page-style DRAM architecture.

The DRAM described below with its hierarchical sensing is fabricated using complementary metal-oxide (CMOS) technology as a single integrated circuit using known processing technology.

Hierarchical (Local and Global) Sensing Architecture

Figure 1:
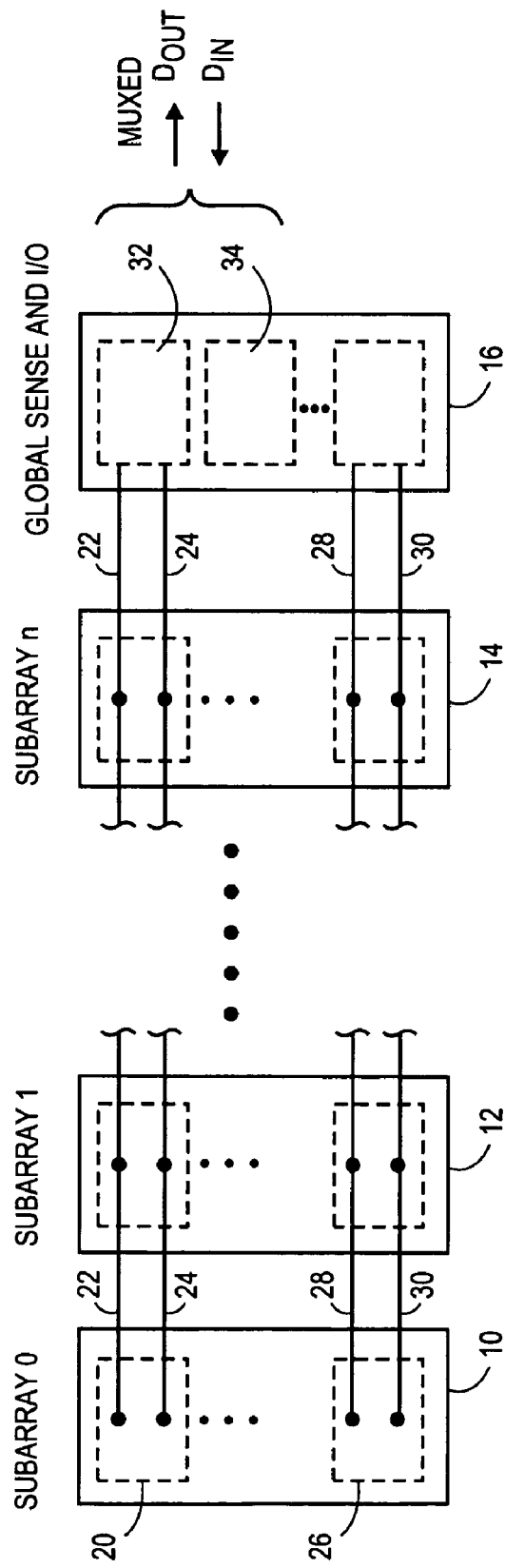
FIG. 1 is a block diagram showing an arrangement of subarrays, global bit lines (GBLs) and a global sense and I/O circuit.

In one embodiment the DRAM is fabricated with a plurality of banks (e.g. 512); one such bank is shown in FIG. 1. The banks each include a plurality of subarrays (e.g. 8) shown as subarray 0, 1 ... n and numbered 10, 12 and 14, respectively in FIG. 1. Each subarray includes a plurality of clusters such as clusters 20 and 26 of subarray 10 where each cluster has a plurality of sense amplifiers (sense amps) generally referred to below as local sense amps (LSAs). Bit lines, precharging and equalization circuits are associated with each LSA within the clusters as described below in conjunction with FIG. 2.

Figure 4:
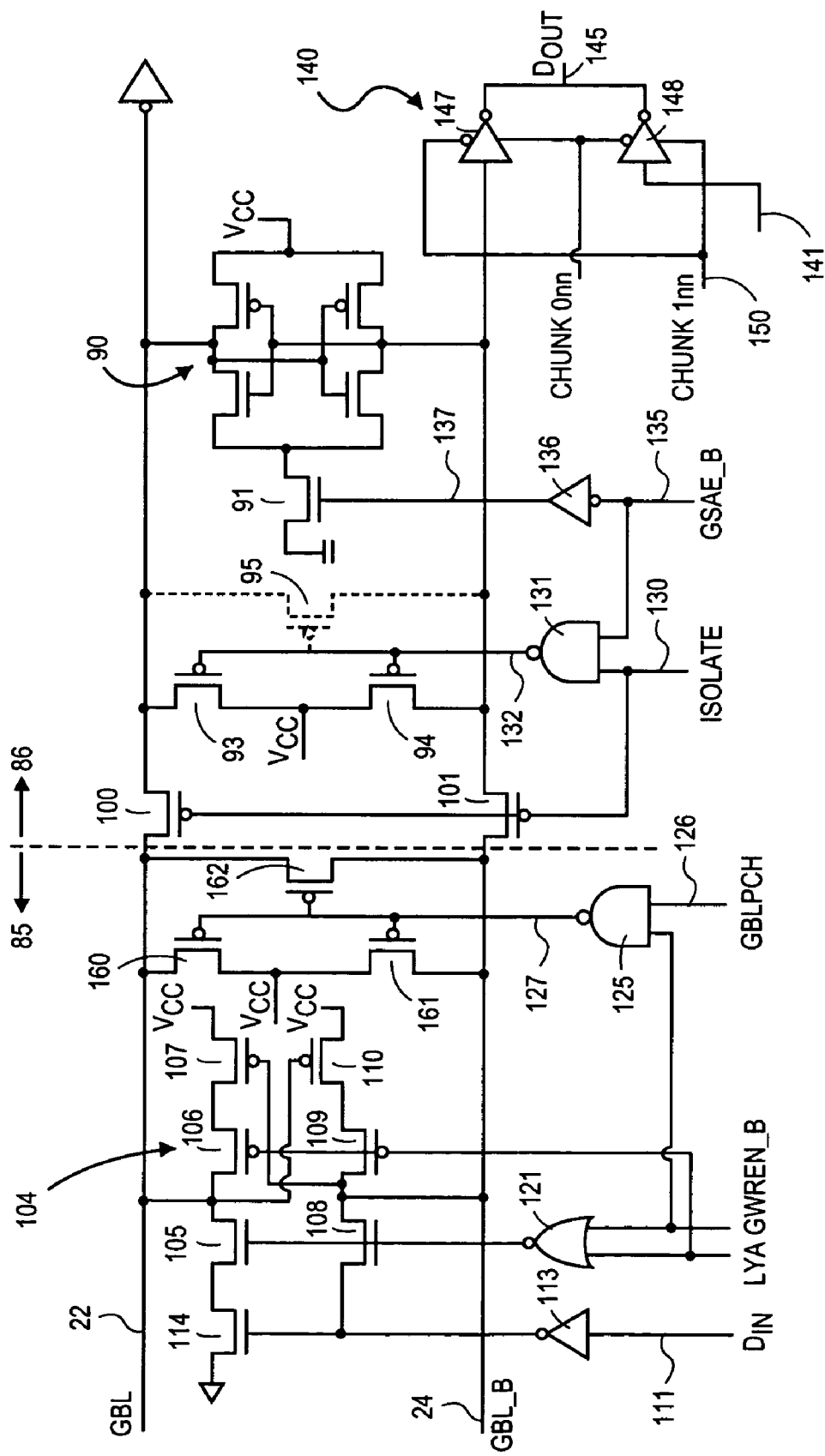
FIG. 4 is an electrical schematic of a global sensing circuit, write buffer and input/output (I/O) circuit.

A pair of global bit lines (GBLs) extend between one cluster in each subarray and terminates in a global sense amp and its associated circuits as shown by circuit 32 of the collective global sense and I/O circuit 16 of FIG. 1. FIG. 4 is the electrical schematic for the sense circuit 32 including its data-in and write buffers. The GBLs 22 and 24 are continuous lines and, as will be seen, are precharged separately from the precharging of the local bit lines associated with each of the LSAs. A second set of GBLs 28 and 30 are shown extending from the cluster 26 in the subarray 10 to the collective global sense and I/O circuit 16. A pair of GBLs extends between a cluster in each subarray and a global sense amp and its associated circuits such as circuit 32.

Figure 2:
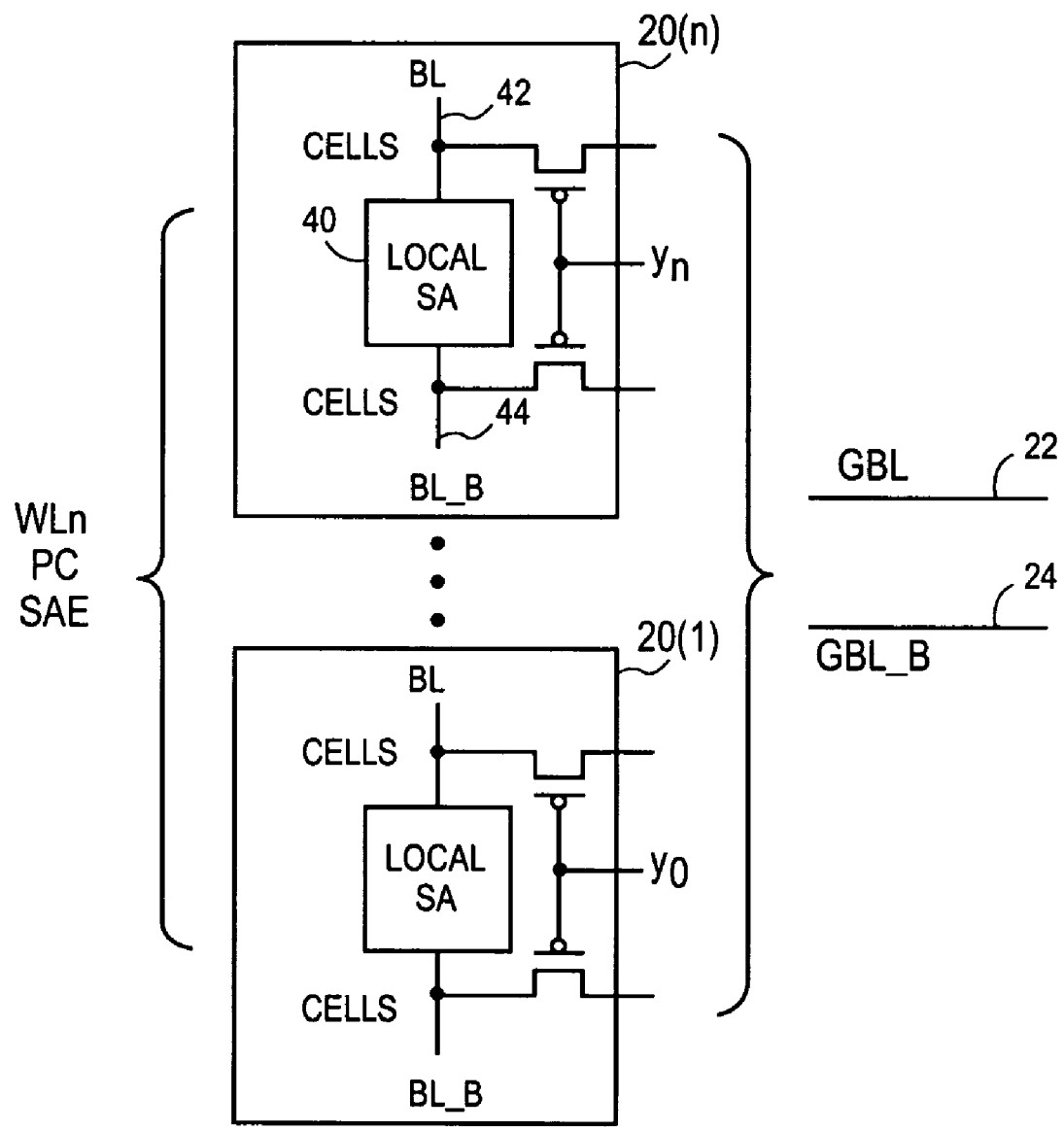
FIG. 2 is a block diagram illustrating a single cluster of local sense amplifiers as they are arranged in each of the subarrays of FIG. 1.

A cluster such as cluster 20 of FIG. 1 is shown in FIG. 2 with LSAs (20(1) to 20(n)) and their associated bit line pairs. Each LSA in a cluster such as LSA 40 includes its associated bit line pairs, such as bit line 42 and its complementary bit line 44 and as will be described later with FIG. 3, precharge and equalization circuits. A plurality of cells are connected to each of the bit lines 40 and 44 and are selected by word lines (WLs) common to all the sense amps in a cluster and all the clusters in a subarray. During a read cycle all the LSAs in a subarray are enabled, however only one pair of bit lines in each cluster is connected to its associated GLBs. The selection of a particular pair of local bit lines in a cluster is controlled by the column signals $Y_0$-$Y_n$. Thus the data from only a single cell associated with a single LSA in a cluster and from a single subarray is read onto a pair of GBLs. The data from the non-selected cells associated with the other LSAs is a selected cluster is restored. During a refresh operation, none of the bit line pair is selected by the $Y_0$-$Y_n$ signals with the refreshing being performed locally. All clusters in a subarray have the same WL selected, and receive the same precharge (PC) signal and sense amp enabled (SAE) signal.

While the selection of a single sense amplifier in a cluster provides multiplexing on a first level, multiplexing occurs on a second level at the output of the global sense and I/O circuit 16. For instance, under control of the "Chunk" signals data is multiplexed on the I/O lines from circuits 32 and 34. This is described in detail for the data-out circuit in FIG. 4. A similar arrangement is used for data-in.

Local Sensing

Figure 3:
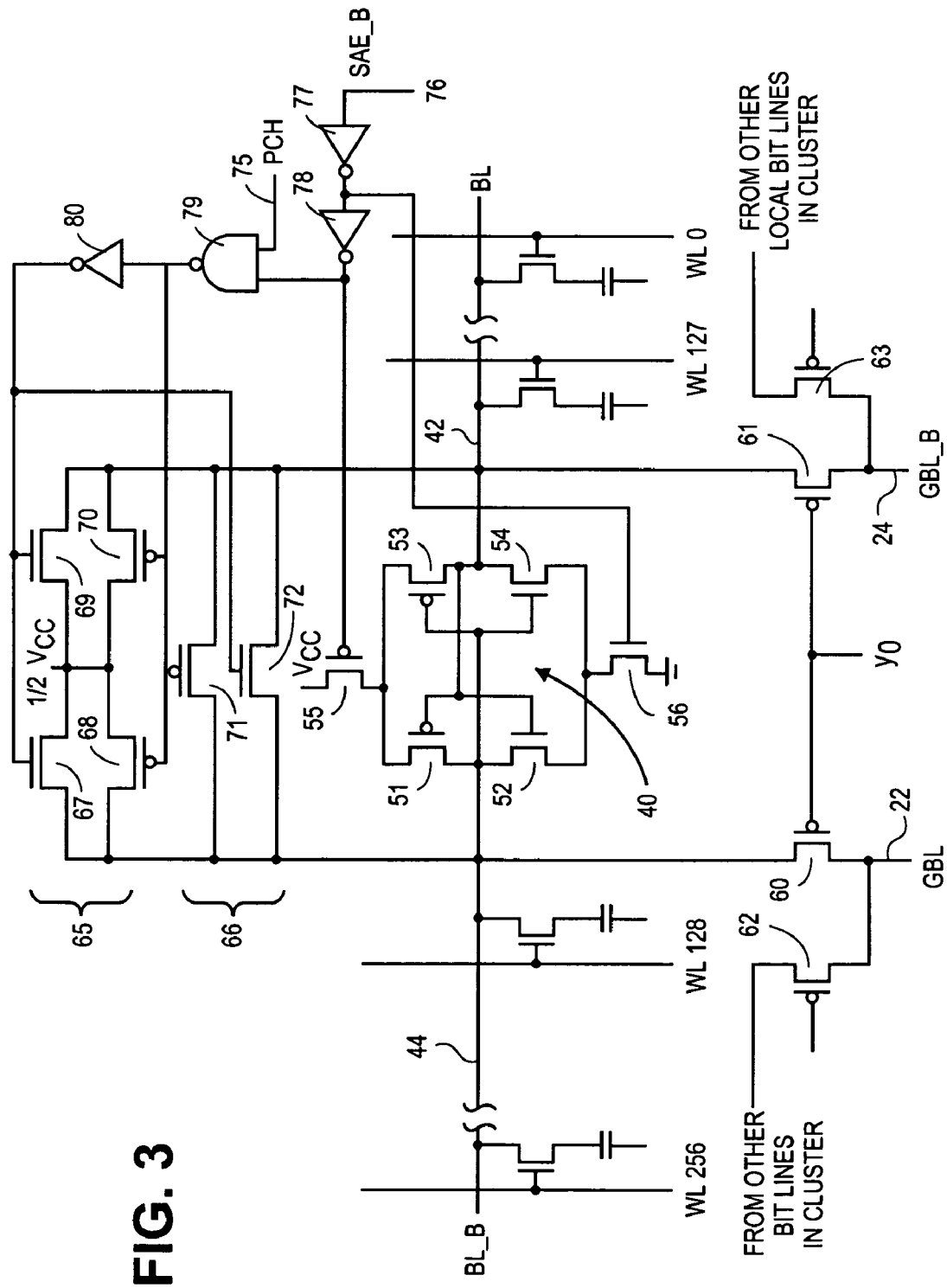
FIG. 3 is an electrical schematic of a single subarray sense amplifier (local sense amp) and its associated bit lines, word lines, precharging circuit and equalization circuit.

A single LSA and its associated circuit such as 20(n) of FIG. 2 is shown in FIG. 3. The LSA 40 comprises a bistable circuit having a first leg with a p-channel transistor 51 and an n-channel transistor 52. The second leg has the p-channel transistor 53 and an n-channel transistor 54. The gates of the transistors 51 and 52 are cross-coupled to the common node between transistors 53 and 54, and likewise the gates of transistor 53 and 54 are coupled to the common node between transistors 51 and 52. The sense amp 40 is enabled by transistors 55 and 56. As is typically the practice, when these transistors are turned on, the sense amp 40 is in a meta or unstable state and the difference in charge on the local bit lines 42 and 44 determines which of the two stable states the sense amp assumes.

There are a plurality of cells coupled to each of the local bit lines 42 and 44 each comprising a transistor and a capacitor. In one embodiment, there are 128 cells associated with the line 44 and an equal number associated with the line 42. The word lines are shown in FIG. 3 as WL 0 to WL 127 for selecting the cells coupled to the bit line 44, and WL 128 to WL 256 for selecting the cells coupled to the bit line 42. A single word line is selected by the address decodes for the entire subarray, thus all the cells along that word line are selected in all the clusters, as mentioned. The local bit lines 42 and 44 are coupled to the GBLs 22 and 24, respectively, through the p-channel transistors 60 and 61 when $Y_0$ is low. As shown by transistors 62 and 63 the other bit lines in the cluster are selectively coupled to the same GBLs when one of the other $Y_n$ signals is low. However, as mentioned, only one pair of local bit lines in one subarray is connected to the GBLs in a read cycle.

The precharge circuit 65 and equalization circuit 66 for the sense amp 40 are also shown in FIG. 3. The precharge circuit 65 includes the n-channel transistors 67 and 69 coupled between the pair of local bit lines 42 and 44, and the p-channel transistors 68 and 70 also coupled between the pair of local bit lines. The common node between these n-channel and p-channel transistors is coupled to a potential equal to one-half Vcc, accordingly the local bit lines are precharged to one-half Vcc. The equalization circuit comprises the p-channel transistor 71 and the n-channel transistor 72 both of which are coupled between the local bit lines. These transistors assure that the potential on the precharge bit lines is balanced.

Vcc may be equal to slightly more than the sum of the threshold voltages of the n-channel or p-channel transistors (e.g. 1 volt). Typical processing variations result in variations in threshold voltages across the wafer. To compensate for this, both re-channel and p-channel transistors are used in both the precharge circuit and equalization circuit. Thus, for instance, in a given circuit the n-channel transistor 72 may have a higher threshold voltage than the average n-channel threshold voltage. In this case the p-channel transistor 71 provides compensation for equalizing the charge between the bit lines.

It should be noted that the circuit of FIG. 3 uses both p and n-channel transistors distributed throughout the local sense amplifier, precharge circuit and equalization circuit. This balanced p-channel and n-channel device density provides strain reduction.

The precharge signal (PCH) on line 75, which is common to all the LSAs in a given subarray, is coupled to the NAND gate 79. The other input to gate 79 is the sense amp enable (SAE) (bar) signal. When the sense amp is deselected and the precharge signal is high, the output of the gate 79 is low, causing the transistors 68, 70 and 71 to conduct. This provides precharging and equalization through the p-channel devices. Through the inverter 80, the output of gate 79 causes the transistors 67, 69 and 72 to conduct, providing precharging and equalization through n-channel devices. When PCH drops in potential or SAE (bar) rises in potential the precharge circuit and equalization circuit are turned off. Note that the gate 79 provides an interlock preventing precharging and equalization when sensing is occurring. The gate 79 and inverter 80 are distributed, one instance is placed with each cluster pair.

Global Sensing

Global sensing from the local bit lines occurs in the circuit 32 and like circuits of the global sense and I/O circuit 16 of FIG. 1, as mentioned. A specific embodiment for circuit 32 is shown in FIG. 4. The GBLs 22 and 24 are directly connected to the data-in (write) section 85 of FIG. 4. A pair of p-channel transistors 100 and 101 provide selective isolation for the GBLs as they extend into the read section 86 of FIG. 4. The input data is applied to line 111 and the output data is coupled to the line 145. The read section 86 of FIG. 4 includes a sense amp 90, again comprising a bistable circuit having cross-coupled inverters, similar to the sense amp 40 of FIG. 3. One terminal of the p-channel transistors of sense amp 90 is coupled to Vcc, and the source regions of the n-channel transistors are coupled to ground through an n-channel transistor 91, which enables the sense amp 90.

A precharging and equalization circuit comprising the p-channel transistors 93, 94 and 95 is coupled between the GBLs in the read section 86. The p-channel transistors 93 and 94 have one terminal coupled to Vcc and their other terminal coupled to the GBLs. The gates of all three transistors are coupled by line 132 to the output of the NAND gate 131. Transistor 95 is not used in some embodiments because of layout constraints.

In one embodiment, data is read from the section 86 sequentially with data from an adjacent global sense amp. For example, first the data on the GBL 24 is coupled to the data out terminal 145 and then the data on an adjacent circuit similar to the circuit shown in FIG. 4 is coupled from line 141 to line 145 under control of the chunk select signals such as Chunk 1 on signal 150. During the precharge state of the global sense circuit, the Chunk 0 and Chunk 1 signals are high (disabled). The n-channel transistor paths of the tri-state buffers 147 and 148 are on. Because of the precharging through transistors 93 and 94, the $D_{OUT}$ line 145 is low. This low signal on line 145 permits different global sense amplifiers to be daisy-chained through $D_{OUT}$. When a read cycle occurs one of the Chunk signals is activated (goes low). For instance, if data is to be read from line 141 and then data from GBL 124, Chunk 1 is driven low to pull the data from line 141, then Chunk 1 becomes high and Chunk 0 becomes low to pull data through inverter 147 from GBL 24.

The write circuitry of section 85 includes an input write buffer 104 having a first cross-coupled branch with n-channel transistor 105, p-channel transistor 106 and n-channel transistor 107. Transistor 105 which is on at this time (through the n-channel transistor 114) couples line 22 either to Vcc or to ground. The gate of the transistor 107 is coupled to receive a signal form the node between transistors 108 and 109. Transistor 114 either provides a path to ground or allows line 22 to rise to Vcc as a function of data-in. This assumes that transistor 106 is conducting (for all operations discussed, LYA is low, LYA is used for circuit analysis). Similarly, the second cross-coupled branch of the write buffer comprises an n-channel transistor 108, a p-channel transistor 109 and a p-channel transistor 110. The source of transistor 108 receives the complement of the data-in signal from inverter 113; the node between transistors 108 and 109 couples line 24 to either Vcc or ground during a write cycle. Once again, transistor 109 is conducting during this time. Note transistor 110 is coupled to the node between transistors 105 and 106. Thus, there are permanently cross-coupled p-channel transistors between GBL 22 and 24 (assuming LYA is low).

Another precharging and equalization circuit is coupled between the GBLs in section 85 of FIG. 4. It comprises the p-channel transistors 160 and 161 which are coupled to Vcc and the equalization, p-channel transistor 162, which is coupled between the GBLs. All three transistors are turned on by the signal on line 127, which is present at the output of the NAND gate 125.

During a read cycle, the global GWREN_B signal is high and LYA is low. For these conditions, the output of the NOR gate 121 is low and therefore transistors 105 and 108 do not conduct. The signal on line 111 (data-in) has no affect on the write buffer 104 and only the cross-coupled p-channel transistors 107 and 110 remain coupled to the GBLs from the write buffer 104.

During a read cycle, the transistors 100 and 101 are turned off for precharging and equalization through transistors 93, 94 and 95. Then when sense amp 90 is enabled there is no isolation signal on line 130 as will be seen from FIG. 5. Note the gate 131 provides an interlock to prevent precharging and equalization when sensing is occurring since once the global sense amp signal drops, the conditions of gate 131 are no longer met and a Vcc potential will appear on line 132, causing transistors 93, 94 and 95 to cease conducting.

During writing, the write buffer 104 has command over the GBLs. The data-in on line 111 drives one global line to Vcc and the other to ground once the write enable bar signal (GWREN_B) drops in potential as will be seen from FIG. 5. Once again, the gate 125 provides an interlock in that once write is enabled, the conditions of gate 125 cannot be met and the output of the gate (line 127) is high, preventing any precharging or equalization.

Timing of the Local and Global Circuits

Figure 5:
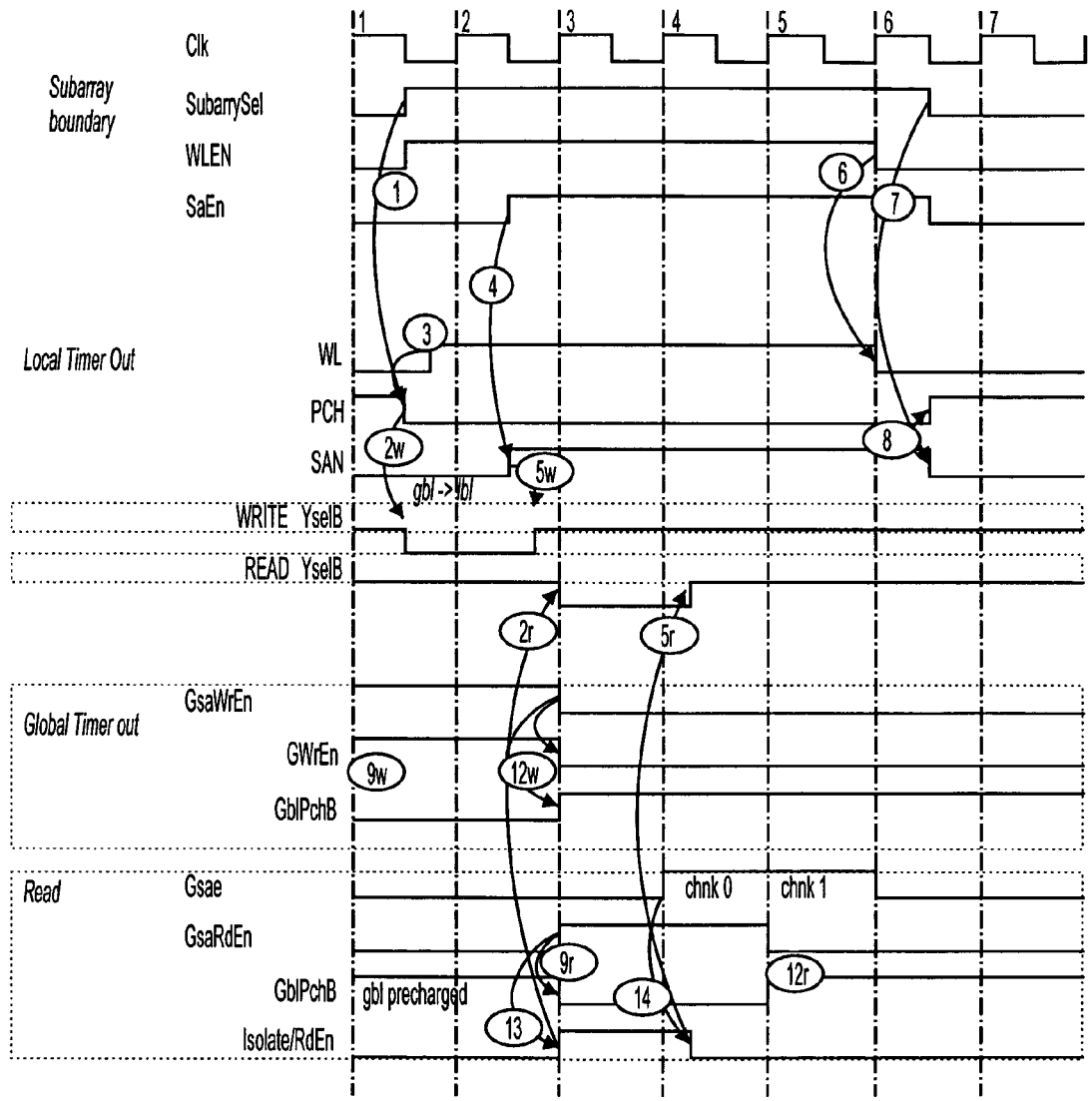
FIG. 5 is a timing diagram for the operation of the circuits of FIGS. 1-4.

Referring now to FIG. 5, the timing diagram signals for the circuits of FIGS. 3 and 4 are shown. On the first line, the memory clock is illustrated with clock cycles 1-7. The subarray boundary timing signals for the selected subarray shows the subarray select signal becoming active half-way through the first clock cycle. This selects a single subarray of FIG. 1. At this time the word line enable signal (WLEN) also becomes active. The subarray select signal causes the local precharging and equalization (PCH) to cease as shown by arrow 1. Then, as shown by arrow 3 the selected WL signal rises. Also shown within the subarray boundary signals is the SaEn signal which becomes active midway through the second clock signal. This signal as shown by arrow 4 controls the SAN signal, which for instance, activates the local sense amp 40 of FIG. 3. Note that while each subarray has a subarray select signal, and only a single subarray is selected for reading and writing from the architecture of FIG. 1, for refreshing, more than one subarray is activated.

In a write cycle, as shown within the local timer out signals, when PCH drops, the Y select signal drops (arrow 2W), coupling a pair of local bit lines to the GBLs. Note as shown by 9W, at this time the output of gate 125 (line 127) is high and thus there is no precharging in section 85 of FIG. 4. Moreover, there is no precharging in section 86 since the signal on line 132 is high. Thus writing can immediately occur. As shown within the Global Timer Out signals, GsaWrEn drops in potential, causing GWrEn to drop and GbPchB to rise (see arrow 12W), ending a write cycle.

During a read cycle after GsandEn signal becomes active the isolate signal rises (arrow 13) and precharging in section 86 occurs (arrow 9r). Also the Y select signal drops connecting a local bit line pair to the GBLs (arrow 2r). At this point in time, the output of the gate 125 of FIG. 4 is high, preventing precharging or equalization of lines 22 and 24 and thus the binary state in the local sense amplifier can be reflected onto the lines 22 and 24. Then, the global sense amplifier is activated as shown by the GSaE signal rising in potential, and following a few gate delays, the isolate signal is removed as shown by arrow 14. Next, as shown by arrow 5r, Y select drops in potential. The binary state on the lines 22 and 24 is sensed within the global sense amplifier 90 of FIG. 4. Chunk 0 can then be read from line 145 followed by chunk 1 from an adjacent GBL. Then as shown by arrows 6, 7 and 8, the read cycle ends, and precharging resumes.

Thus, a hierarchical sensing mechanism has been described which uses both local sense amplifiers and global sense amplifiers.

What is claimed is:

1. A DRAM with hierarchical sensing, the DRAM comprising:
a pair of global bit lines (GBLs) extending between a plurality of subarrays, the GBLs terminating in a global sense amp;
a cluster of subarray sense amps (SSAs) in each subarray, each SSA having a pair of local bit lines coupled to memory cells, wherein the memory cells are selected by word lines extending to all the memory cells in the cluster; and
local precharging circuit associated with each pair of local bit lines,
wherein each cluster being controlled such that a single word line is selected throughout the cluster and each SSA in the cluster is enabled during a read cycle, and wherein only one pair of local bit lines from the cluster is coupled to the GBLs.

2. The DRAM of claim 1, including:
equalization circuit associated with each pair of local bit lines, and
global precharging and equalization circuits associated with the GBLs, wherein the local bit lines are precharged to a potential less than the potential to which the GBLs are precharged.

3. The DRAM of claim 1, wherein the local bit lines are precharged to a potential of approximately one-half the potential to which the GBLs are precharged.

4. The DRAM of claim 2, wherein the local precharging and equalization circuits comprise both p-channel and n-channel transistors.

5. The DRAM of claim 2, wherein the local precharging and equalization circuits include both p-channel and n-channel transistors, and wherein the local bit lines are charged to a potential slightly larger than the sum of the threshold voltages of a p-channel and n-channel transistors.

6. A memory having a plurality of banks wherein the DRAM of claim 1 comprises a single bank in the memory.

7. The memory of claim 6, including:
a plurality of clusters of SSAs in each subarray,
a plurality of GBLs, and
a plurality of global sense amplifiers.

8. A method of sensing in a DRAM, the method comprising:
precharging to a first potential a plurality of local bit line pairs each associated with a sense amplifier;
precharging a pair of global bit lines (GBLs) to a second potential, greater than the first potential;
sensing the binary state stored on memory cells selectively coupled to the local bit line pairs with local sense amplifiers;
coupling one of the plurality of local bit line pairs to the GBLs;
sensing the binary state on the GBLs with a global sense amplifier; and
isolating the GBLs from the local bit lines, during precharging of the global sense amplifier.

9. The method of claim 8, wherein the second potential is approximately equal to twice the first potential.

10. The method of claim 8, including restoring the sensed binary state to the selected memory cells.

11. The method of claim 8, including floating outputs of a write buffer coupled to the GBLs during the sensing of the binary state on the GBLs.

12. The method of claim 8, including interlocking a local precharge and equalization signal and a local sense amplifier enable signal so that precharging and equalization is prevented when sensing is occurring in the local sense amplifier.

13. The method of claim 8, including interlocking a global precharge and equalization signal and a global sense amplifier enable signal so that precharging and equalization is prevented when sensing is occurring in the global sense amplifier.

14. A method for sensing in a CMOS DRAM which operates from an applied potential of Vcc, the method comprising:
   precharging a plurality of local bit line pairs each associated with a sense amplifier to a potential of approximately one-half Vcc;
   precharing a pair of global bit lines (GBLs) to Vcc;
   initiating sensing of a binary state on the plurality of local bit line pairs with the sense amplifiers;
   coupling one of the plurality of local bit line pairs to the GBLs; and
   isolating the local bit lines from the GBLs as sensing occurs in a global sense amplifier.

15. The method defined by claim 14, wherein Vcc is approximately equal to the sum of the threshold voltages of a p-channel and n-channel transistor used in the CMOS DRAM.

16. The method of claim 14, including activating an equalization circuit comprising both n-channel and p-channel transistors during the precharging of the local bit line pairs.

17. The method of claim 14, including restoring the sensed binary states to the memory cells selectively coupled to the local bit line pairs.

18. The method defined by claim 14, wherein sensing the binary state stored on memory cells comprises selecting a word line which activates the memory cells in the local sense amplifiers.

19. The method of claim 14, including isolating the global sense amplifier from the section of the GBLs coupled to the local bit line pairs during precharging of the global sense amplifier.

\* \* \* \* \*